(12) United States Patent
Park et al.

(10) Patent No.: US 7,223,721 B2
(45) Date of Patent: May 29, 2007

(54) RESIST AND ETCHING BY-PRODUCT REMOVING COMPOSITION AND RESIST REMOVING METHOD USING THE SAME

(75) Inventors: Dong-jin Park, Osan (KR); Kyung-dae Kim, Suwon (KR); Sang-mun Chon, Sungnam (KR); Jin-ho Hwang, Suwon (KR); Il-hyun Sohn, Yongin (KR); Sang-oh Park, Sungnam (KR); Pil-kwon Jun, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 411 days.

(21) Appl. No.: 10/739,203

(22) Filed: Dec. 19, 2003

(65) Prior Publication Data

US 2004/0142836 A1  Jul. 22, 2004

Related U.S. Application Data

(62) Division of application No. 10/059,150, filed on Jan. 31, 2002, now Pat. No. 6,713,440.

(30) Foreign Application Priority Data

Aug. 17, 2001  (KR) .............................. 2001-49601

(51) Int. Cl.
*B08B 3/04* (2006.01)
(52) U.S. Cl. .................. 510/175; 510/176; 134/1.3
(58) Field of Classification Search .............. None
See application file for complete search history.

(56) References Cited

U.S. PATENT DOCUMENTS

| 5,981,454 | A | 11/1999 | Small |
| 6,221,818 | B1 | 4/2001 | Lee |
| 6,242,400 | B1 | 6/2001 | Lee |
| 6,274,537 | B1 * | 8/2001 | Park et al. .................. 510/176 |
| 6,276,372 | B1 | 8/2001 | Lee |
| 6,398,874 | B2 * | 6/2002 | Park et al. .................... 134/2 |
| 6,508,887 | B1 * | 1/2003 | Park et al. .................... 134/2 |
| 7,037,852 | B2 * | 5/2006 | Park et al. ................. 438/745 |
| 2001/0049346 | A1 * | 12/2001 | Park et al. .................. 510/175 |

FOREIGN PATENT DOCUMENTS

| FR | 2 782 175 | 2/2000 |
| FR | 2 782 176 | 2/2000 |
| GB | 2 340 256 A | 2/2000 |
| JP | 9-96911 | 4/1997 |
| JP | 2001152190 | 6/2001 |
| KR | 2000-016878 | 3/2000 |
| KR | 2001-0048330 | 6/2001 |
| WO | WO 01/96964 A1 | 12/2001 |

* cited by examiner

*Primary Examiner*—Gregory Webb
(74) *Attorney, Agent, or Firm*—Volentine & Whitt, PLLC

(57) ABSTRACT

A resist removing composition having a superior capability for removing a resist, polymer, organometallic polymer and etching by-products such as metal oxide, which does not attack underlying layers exposed to the composition and which does not leave residues after a rinsing step. The resist removing composition contains alkoxy N-hydroxyalkyl alkanamide and a swelling agent.

18 Claims, 4 Drawing Sheets

RESIST AND ETCHING BY-PRODUCT REMOVING COMPOSITION AND RESIST REMOVING METHOD USING THE SAME

This is a divisional of U.S. patent application Ser. No. 10/059,150, filed Jan. 31, 2002, now U.S. Pat. No. 6,713,440 the entire contents of each of which are hereby incorporated herein by reference for all purposes as if fully set forth herein.

BACKGROUND OF THE INVENTION

1. Field of the Invention

The present invention relates to a resist or etching by-product removing composition and a resist removing method using the same.

2. Description of the Related Art

Semiconductor devices are manufactured via an elaborate series of discrete and sequential processes. After certain of these processes for manufacturing the semiconductor device, e.g., a dry etching process or an ion implantation process, a resist pattern that was used as a mask must be removed. Also, in the case when the resist pattern was misaligned, it must be removed to form a new and correctly aligned resist pattern.

An important criterion of the resist removing process is to completely remove resist and/or etching by-products from the surface of a substrate as fast as possible while not attacking the underlying layers. In general, the typical resist removing process combines a dry stripping step, such as an ashing step, and a wet stripping step using an organic stripper, to remove impurities from the surface of an integrated circuit substrate. Such impurities could be the remaining resist which was not completely removed during the ashing step. Other impurities may comprise the etching by-products generated during etching steps for forming various patterns, for example, single or multiple interconnection patterns formed of tungsten, aluminum, copper, titanium or titanium nitride. Impurities may also be generated during the etching step for forming contact (via) holes exposing the interconnection patterns.

The etching by-products to be removed include organic polymers produced by the reaction of plasma and those components comprising the resist pattern itself, such as carbon (C), hydrogen (H), or oxygen (O), during plasma etching or reactive ion etching (RIE). The etching by-products could also include organometallic polymers produced when interconnection materials are back-sputtered to side walls of the resist pattern and contact holes are formed during an etching or ashing step. The etching by-products could also comprise insulating materials or metal oxides formed when an insulation layer under the interconnection pattern is over-etched and then back-sputtered.

Certain compositions for removing resists or etching by-products are disclosed in U.S. Pat. Nos. 6,242,400 and 6,221,818. The disclosed compositions include a basic amine reducing agent, such as hydroxylamine or monoethanolamine, a polar solvent, and an organic acid such as catechol, as its essential components. However, since the basic amine of these conventional composition is relatively weak in its reducing power, it cannot completely remove etching residues, e.g., a metal oxide or organometallic polymer, that are produced when new interconnection or contact holes are formed. Thus, before the ashing step is performed, a nitric acid pre-treatment step must be carried out.

Since the conventional compositions are comprised largely of organic components and have a high viscosity, etching by-products are not completely removed in the case of rinsing only with deionized water, thereby leaving a residue on the substrate that causes organic contamination.

Also, since the conventional compositions easily corrode an underlying layer exposed to the composition, such as the interconnection layer, the profile of the interconnection layer pattern may be deformed, by undercutting for example. Thus, an additional rinsing step using an alcohol-based rinsing agent such as isopropyl alcohol (IPA) must be performed after the ashing step.

Therefore, since a nitric acid treatment pre-removal step must be performed before the ashing step, and an isopropyl alcohol post-removal treatment step is performed after the ashing step, the resist removal process becomes more complicated and processing time is prolonged, thereby lowering productivity.

Also, since the pre-removal material, e.g., nitric acid, and the post-removal material, e.g., isopropyl alcohol, are further required as well as the resist removal material, the manufacturing costs increase. Moreover, since discrete baths for the pre-removal step and the post-removal step are required, the resist removing apparatus itself becomes more complicated and takes up greater floor space.

SUMMARY OF THE INVENTION

In light of the problems and shortcomings of the conventional art, it is an object of the present invention to provide a composition having a superior capability for removing a resist, polymer, organometallic polymer and/or etching by-products, such as metal oxide, while at the same time, the composition does not attack underlying layers exposed to the composition and does not leave residues after a rinsing step.

It is another object of the present invention to provide a method of removing resist or etching by-products using the composition having the capabilities as described above.

To achieve the first object of the present invention, there is provided a resist removing composition comprising alkoxy N-hydroxyalkyl alkanamide, and a swelling agent.

Preferably, the resist removing composition contains at least 10 wt % of alkoxy N-hydroxyalkyl alkanamide and at least 0.01 wt % of the swelling agent. Hydroxylamine salt is preferably used as the swelling agent. Suitable hydroxylamine salts include hydroxylamine sulfate, hydroxylamine hydrochloride, hydroxylamine nitrate, hydroxylamine phosphate, hydroxylamine oxalate, hydroxylamine citrate, and mixtures thereof.

The resist removing composition may further comprise at least one compound selected from the group consisting of a polar material having a dipole moment of 3 or greater, an attack inhibitor, and alkanolamine.

The attack inhibitor effectively suppresses damage to an existing interconnection layer when the interconnection layer is exposed to the resist removing composition. The alkanolamine or polar material having a dipole moment of 3 or greater improves the resist or polymer removing capability.

To achieve another object of the present invention, there is provided a method of removing a resist comprising the steps of providing a substrate having a resist layer formed thereon, and contacting the substrate with a resist removing composition comprising alkoxy N-hydroxyalkyl alkanamide and a swelling agent to remove the resist layer from the substrate.

The composition according to the present invention has a superior capability for removing resist and can effectively remove polymer, organometallic polymer and etching by-products, such as metal oxides. Also, the composition does not leave residues after a rinsing step, and does not attacking underlying layers exposed to the composition.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF PREFERRED EMBODIMENTS

Hereafter, a composition for removing a resist or etching by-products according to the present invention and a removing method using the same will be described in detail. However, the present invention is not limited to the following embodiments and may be implemented in various alternative forms. Unless stated otherwise, the percent by weight (wt %) used throughout the specification is calculated on the assumption that the specific gravity of each component is 1.

The term "resist" used throughout the specification and the appended claims is understood to encompass not only photoresist, but also etching by-products and other polymers. Moreover, for simplicity and ease of discussion, a composition for removing the resist, etching by-products and other polymers is referred to herein as a resist removing composition.

The resist removing composition according to the present invention includes alkoxy N-hydroxyalkyl alkanamide and a swelling agent. Preferably, the resist removing composition includes at least 10 wt % of alkoxy N-hydroxyalkyl alkanamide and at least 0.01 wt % of a swelling agent. More preferably, the swelling agent is included in an amount of 0.01 to 30 wt %.

The alkoxy N-hydroxyalkyl alkanamide is represented by formula 1:

$$R_4\text{—}O\text{—}R_3\text{—}CO\text{—}N\text{—}R_1R_2OH \quad \text{(Formula 1)}$$

wherein $R_1$ is a hydrogen atom or a $C_1$ to $C_5$ hydrocarbon, and $R_2$, $R_3$ and $R_4$ are each independently $C_1$ to $C_5$ hydrocarbons.

In the preferred embodiment, $R_1$ is a hydrogen atom, $R_2$ is —$CH_2CH_2$—, $R_3$ is —$CH_2CH_2$—, and $R_4$ is —$CH_3$—.

Suitable swelling agents include a hydroxylamine salt. Examples of the hydroxylamine salt include hydroxylamine sulfate, hydroxylamine hydrochloride, hydroxylamine nitrate, hydroxylamine phosphate, hydroxylamine oxalate, hydroxylamine citrate, and mixtures thereof. Also, a hydroxylamine salt having $C_1$ to $C_5$ alkyl groups substituted therein can be used.

The function of the resist removing composition according to the present invention is apparently performed by the following reaction mechanism.

The alkoxy N-hydroxyalkyl alkanamide contains a hydroxy group (—OH), an alkoxy group (—$OR_4$), and a carbonyl group (C=O). Consequently, the resist removing composition according to the present invention is very effective in exfoliation and dissolution of a resist and polymer.

Also, as shown in the following reaction formula 1, the alkoxy N-hydroxyalkyl alkanamide reacts with an organometallic polymer, thereby easily removing the organometallic polymer from the surface of a substrate:

(Reaction formula 1)

wherein Mp represents an organometallic polymer.

The hydroxylamine salt improves the capability of removing polymer by its swelling and reducing actions. A solution of the hydroxylamine salt allows the viscosity of the resist removing composition to be in a range that is sufficient to easily remove the resist removing composition with deionized water. Preferably, the solution of the hydroxylamine salts allows the viscosity of the resist removing composition to be 20 cp or less.

The composition according to the present invention may further include at least one compound selected from the group consisting of a polar material having a dipole moment of 3 or greater, an attack inhibitor, and alkanolamine. In this case, 0.01 to 30 wt % of the attack inhibitor, 0.01 to 60 wt % of the polar material having a dipole moment of 3 or greater, and 0.01 to 30 wt % of the alkanolamine are preferably included in the composition according to the present invention.

For the polar material having a dipole moment of 3 or greater, water, methanol or dimethyl sulfoxide may be employed.

Suitable attack inhibitors include an aromatic compound such as benzotriazole, catechol, gallic acid, or an aliphatic carboxylic compound selected from the group consisting of acetic acid, citric acid, lactic acid and succinic acid.

Suitable alkanolamines include monoalkanolamine, dialkanolamine and trialkanolamine. $C_1$ to $C_{10}$ monoalkanolamine represented by the following formula 2 is also a suitable alkanolamine:

$$R_5\text{—}NH\text{—}R_6OH \quad \text{(Formula 2)}$$

wherein $R_5$ is a hydrogen atom or a $C_1$ to $C_5$ hydrocarbon, and $R_6$ is a $C_1$ to $C_5$ hydrocarbon.

In the preferred embodiment, a monoethanolamine, in which $R_5$ is a hydrogen atom and $R_6$ is —CH$_2$CH$_2$—, is preferably used as the alkanolamine.

The polar material having a dipole moment of 3 or greater exhibits high solubility with respect to crosslinked polymer and resist. In other words, such polar material can effectively remove any polymer that is strongly bonded on the side walls of the resist pattern and the surface of the exposed underlying layer. Also, such a polar material facilitates the resist removal itself.

The attack inhibitor serves as a dissolving agent for an organometallic polymer and prevents interconnections exposed to the surface of an integrated circuit substrate from being corroded or attacked. In most cases, a metallic oxide layer is formed on the surface of interconnection patterns exposed to the surface of the integrated circuit substrate. If the metallic oxide layer reacts with the reducing agent to be converted into metallic ions, the attack inhibitor causes chelation together with the metal ions to form a chelate compound. Consequently, the surface of the exposed metal interconnection pattern is covered with a stable chelate compound, whereby corrosion or attack of the interconnection pattern can be effectively prevented.

The alkanolamine effectively imparts an improved capability of removing polymer or organometallic polymer to the resist removing composition according to the present invention.

Therefore, the resist removing composition according to the present invention has a superior capability of removing a resist and can effectively remove a polymer, organometallic polymer and metal oxide. Also, the resist removing composition has an appropriate viscosity so as to be sufficiently rinsed with deionized water without attacking underlying layers exposed to the composition, thereby eliminating all organic residues.

Exemplary resist removing compositions within the scope of the present invention and the respective weight % of each component are provided in Table 1.

other compositions in the case when a material normally attacked by a resist removing composition, such as an interconnection, is not exposed to the resist removing composition. Also, the compositions 1, 3, 4 and 7, which do not include a polar material having a dipole moment of 3 or greater, may also achieve the same effect as the other compositions in the case when the amount of polymer to be removed is very small, or a pre-removal step has been carried out. Similarly, the compositions 1, 2, 3 and 5, which do not include an alkanolamine, may also achieve the same effect as the other compositions in the case when the amount of polymer organometallic polymer to be removed is very small.

As described above, the resist removing compositions exhibit a superior capability for removing the resist and the polymer, organometallic polymer and metal oxide, which are etching by-products. Also, they do not attack the underlying layer, e.g., an interconnection layer, which is exposed, and are completely removed with deionized water so that they do not remain on the substrate. In addition, the above-described materials are cheaper than the components of the conventional resist removing compositions.

Since the composition according to the present invention has a superior capability of removing polymer, it can be advantageously employed for a process of removing an organic polymer material, e.g., polyimide, in addition to photoresist employed to manufacture a semiconductor device or flat-type display device.

Method for Removing Resist

Figure 1:
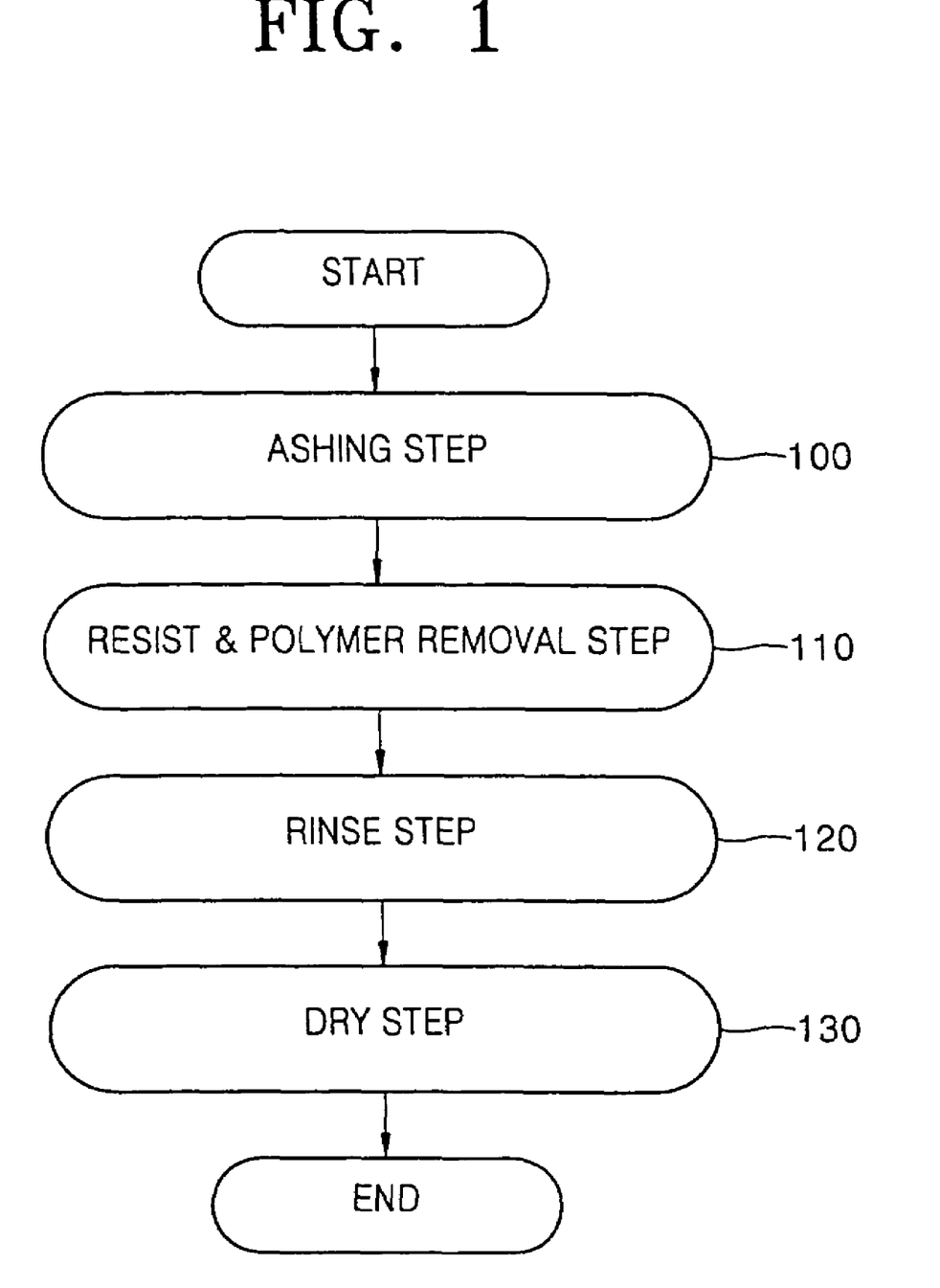
FIG. 1 is a flow diagram illustrating a process of removing a resist or etching by-products according to the present invention.

The steps of removing the resist using the resist removing composition according to the present invention will be described with reference to FIG. 1.

First, a resist pattern is formed through a conventional photolithography sequence. Subsequently, various processes for completing a semiconductor device, for instance, an etching (dry or wet) process or an ion implantation process, are performed using the resist pattern as a mask.

TABLE 1

Exemplary Resist Removing Compositions

| Resist removing composition | Alkoxy N-hydroxyalkyl alkanamide (wt %) | Swelling agent (wt %) | Polar material (wt %) | Attack inhibitor (wt %) | Alkanolamine (wt %) |
|---|---|---|---|---|---|
| 1 | 10–70 | 0.01–30 | | | |
| 2 | 10–70 | 0.01–30 | 0.01–60 | | |
| 3 | 10–70 | 0.01–30 | | 0.01–30 | |
| 4 | 10–70 | 0.01–30 | | | 0.01–30 |
| 5 | 10–70 | 0.01–30 | 0.01–60 | 0.01–30 | |
| 6 | 10–70 | 0.01–30 | 0.01–60 | | 0.01–30 |
| 7 | 10–70 | 0.01–30 | | 0.01–30 | 0.01–30 |
| 8 | 10–70 | 0.01–30 | 0.01–60 | 0.01–30 | 0.01–30 |
|   | (35–50) | (6–13) | (25–45) | (1–15) | (1–10) |

Note that the more preferred range values are provided in parentheses in Table 1.

The elements of the above-described resist removing compositions are optimized such that a resist and polymer can be effectively removed, and the underlying layer exposed to a resist removing composition is minimally attacked by such compositions, and the composition has a sufficient viscosity so as to be readily rinsed with deionized water without leaving a residue.

The compositions 1, 2, 4 and 6, which do not include an attack inhibitor, may also achieve the same effect as the Then, an ashing step, which is a dry stripping process, is performed on the substrate where the resist pattern is formed (step 100). Subsequently, a wet stripping step is performed (step 110). In the wet etching step, the portion of the substrate where the ashing step was performed is allowed to contact a resist removing composition, such as those listed in Table 1, to remove the resist, polymer or organometallic polymer. This is accomplished by placing the resist removing composition in a bath, and then dipping the substrate into the bath. Alternatively, the resist removing composition may be sprayed onto the substrate.

In the case of using the resist removing compositions according to the present invention, the resist removal step is performed at a low temperature of 70° C. or below, specifically, in the range from room temperature to 70° C., preferably, from 45° C. to 70° C. A contact time in the range from about 10 to about 30 minutes is preferred.

The resist removed by the resist removing composition according to the present invention may comprise a resist suitable for short wavelength exposure, such as a resist for an ArF excimer laser (193 nm) or a resist for an $F_2$ excimer laser (157 nm), as well as a resist for a conventional i-line (365 nm) or a resist for a KrF excimer laser (248 nm).

After the resist is completely removed, the resist removing composition and the dissolved resist remaining on the substrate are rinsed away (step 120) using deionized water. If necessary, the rinsing step can be performed again. Finally, the substrate is dried by a spin dry method, or a dry method using isopropyl alcohol to remove the deionized water remaining on the substrate (step 130).

After the drying step 130, the substrate is transferred for subsequent processing. When a resist is used again in a subsequent step, it is again removed through the steps shown in FIG. 1 after the subsequent step is completed.

Since the resist removing composition according to the present invention has a superior capability for removing the resist, polymer, organometallic polymer or metal oxide, it is suitable for use in those cases where conventional organic strippers have failed to remove the byproducts of a etching process. Accordingly, the pre-removal step (before the ashing process) is not necessary, unlike the conventional art. Also, since the layer underlying the resist is prevented from being attacked, and residues or organic residual layers do not remain on the surface, the post-removal step (after the ashing process) can be omitted as well, unlike the conventional art. Thus, according to the present invention, the resist can be completely removed by a simple and streamlined process, compared to the conventional resist removing process. Further, according to the present invention, the resist removing apparatus does not require the separate baths necessary for performing the pre-removal step and the post-removal step. Thus, the resist removing apparatus can be simplified and therefore occupies less floor space. Also, since materials used in the pre-removal step and the post-removal step, such as nitric acid or IPA, are not necessary, the cost of production is decreased while the productivity of the semiconductor manufacturing process can be remarkably enhanced.

Further details of the present invention are described with reference to the following examples.

EXAMPLE 1

This example illustrates the polymer removing capabilities of various compositions having different composition ratios. First, wafers for treatment of the compositions according to the present invention were prepared in the following manner. BoroPhosphoSilicate Glass (BPSG) layers were formed to a thickness of 5000 Å on a plurality of substrates, respectively. Then, a titanium layer and a titanium nitride layer were formed to a thickness of 200 Å, respectively, and annealed. Then, an aluminum layer was deposited to a thickness of 6000 Å and flowed. Next, a titanium nitride layer serving as a capping layer was formed on the aluminum layer, and an interlayer dielectric film was then formed to a thickness of 10000 Å. Then, a photoresist layer was coated on the interlayer dielectric film to a thickness of approximately 0.3 μm. Thereafter, the wafer coated with the resist composition for an ArF excimer laser was soft-baked at 130° C. for 90 seconds, exposed using an ArF excimer laser stepper ((manufactured by ISI Co. and having a numerical aperture (NA) of 0.6 and a depth of focus (σ) of 0.7)), post-exposure-baked at 120° C. for 90 seconds, and developed with 2.38 wt % of a TMAH solution, thereby forming a resist pattern defining a via or contact hole. The interlayer dielectric film was etched with a buffered oxide etchant using the photoresist pattern as an etching mask, thereby providing a 400–500 μm wide via.

After forming the via, the respective substrates were dipped into 7 baths containing the compositions listed in Table 2. The temperatures of the baths were maintained at 60° C. After being submerged for about 20 minutes, the substrates were rinsed with deionized water for about 5 minutes and dried, and then the resultant materials was identified using scanning electron microscopy (SEM). In Table 2, HAS indicates a hydroxlyamine sulfate, MHPA indicates methoxy N-hydroxyethyl propane amide, BTA indicates bezotriazole and MEA indicates monoethanolamine.

TABLE 2

Resist and Polymer Removal Capability

| Composition | HAS (wt %) | MHPA (wt %) | H₂O (wt %) | BTA (wt %) | MEA (wt %) | Resist and polymer removing capability |
|---|---|---|---|---|---|---|
| 1 | 7 | 59 | 34 | x | x | ⊙ |
| 2 | 13 | 46 | 41 | x | x | ⊙ |
| 3 | 12 | 44 | 40 | 4 | x | □ |
| 4 | 8 | 38 | 51 | 4 | x | ○ |
| 5 | 8 | 47 | 39 | 6 | x | ○ |
| 6 | 7 | 57 | 33 | 3 | x | □ |
| 7 | 6 | 46 | 43 | 4 | x | ○ |
| 8 | 6 | 41 | 47 | 6 | x | ○ |
| 9 | 7 | 41 | 37 | 3 | 7 | □ |
| 10 | 7 | 34 | 46 | 4 | 9 | ○ |
| 11 | 6 | 41 | 34 | 5 | 12 | ○ |
| 12 | 6 | 34 | 30 | 3 | 9 | ⊙ |
| 13 | 6 | 39 | 37 | 4 | 15 | ○ |
| 14 | 5 | 33 | 37 | 5 | 20 | ○ |
| 15 | 7 | 53 | 31 | x | 9 | ⊙ |
| 16 | 12 | 43 | 38 | x | 7 | ⊙ |

(○: Good; □: Better; ⊙: Best)

The results were based on the relative amounts of remaining polymer and resists through SEM observation. The good state indicated by "○" is similar to the case of using the conventional organic stripper (to be referred to as a stripper A), the better state indicated by "□" is an improved state compared to the conventional case, and the best state indicated by "⊙" is a noticeably improved state compared to the conventional case.

As demonstrated in Table 2, the resist or polymer removing capability of the composition according to the present invention is at least the same as, and in most case, substantially better than that of the stripper A.

EXAMPLE 2

This example discerns whether the compositions according to the present invention have interconnection layers that were attacked or not. In this example, wafers having vias were prepared in the same manner as in Example 1 and the compositions listed in Table 3 were employed. Then, the attacked states of interconnection layers, e.g., undercutting, were examined.

TABLE 3

Occurrence of Undercutting

| Composition | HAS (wt %) | MHPA (wt %) | H₂O (wt %) | BTA (wt %) | MEA (wt %) | Occurrence of undercutting |
|---|---|---|---|---|---|---|
| 1 | 7 | 59 | 34 | x | x | x |
| 2 | 13 | 46 | 41 | x | x | x |
| 3 | 12 | 44 | 40 | 4 | x | x |
| 4 | 8 | 38 | 51 | 4 | x | x |
| 5 | 8 | 47 | 39 | 6 | x | x |
| 6 | 7 | 57 | 33 | 3 | x | x |
| 7 | 6 | 46 | 43 | 4 | x | x |
| 8 | 6 | 41 | 47 | 6 | x | x |
| 9 | 11 | 41 | 37 | 3 | 7 | Δ |
| 10 | 7 | 34 | 46 | 4 | 9 | Δ |
| 11 | 7 | 41 | 34 | 5 | 12 | Δ |
| 12 | 6 | 52 | 30 | 3 | 9 | Δ |
| 13 | 6 | 39 | 37 | 4 | 15 | Δ |
| 14 | 5 | 33 | 37 | 5 | 20 | Δ |
| 15 | 7 | 53 | 31 | x | 9 | ○ |
| 16 | 12 | 43 | 38 | x | 7 | ○ |

(An "○" indicates that undercutting occurred, a "Δ" indicates that slight undercutting occurred, and an "x" indicates that no undercutting occurred.)

As shown in Table 3, when using the compositions according to the present invention, only a few of the interconnection layers were attacked as evidenced by the degree of undercutting. Even though trivial undercutting may have occurred, it is considered negligible compared to the case of using the conventional stripper A. Also, it was confirmed that in the case where MEA was contained in the composition, occurrence of undercutting could be more effectively prevented by further including BTA in addition to the MEA.

EXAMPLE 3

This example illustrates a performance comparison between the composition according to the present invention, the conventional stripper A, and another conventional organic stripper (to be referred to as a stripper B).

Figure 2:
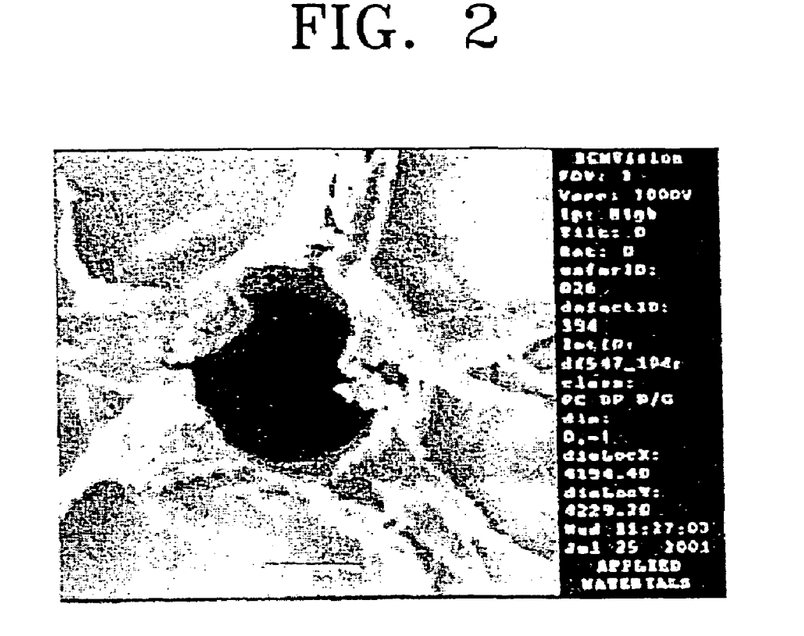
FIG. 2 is a scanning electron microscope (SEM) photograph of the top view of a via immediately after an ashing step is conducted, with the via being formed though photolithography.

The via having a width of 400–500 μm was formed in the same manner as in Example 1, and then an ashing step was performed. The top view of the resultant via was observed using SEM and the observation results are shown in FIG. 2, where it is seen that a large amount of polymer remains around the via circumference.

The wafer subjected to the ashing step was dipped into the composition according to the present invention at 65° C. for 20 minutes, rinsed with deionized water and then dried. Thereafter, the top view and cross-sectional view of the via were observed using SEM and the observation results are shown in FIGS. 3A and 3B.

Figure 4A:
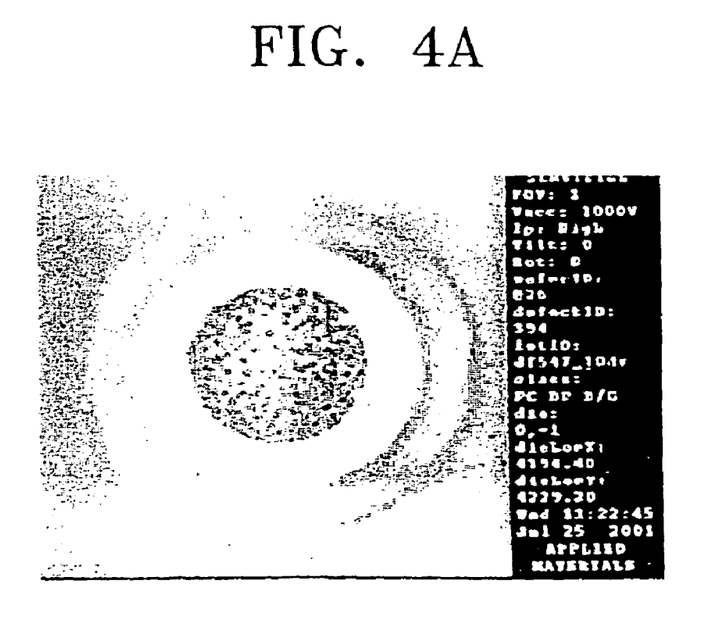
FIGS. 4A and 4B are SEM photographs of the top view and sectional view, respectively, of a via after removing a resist and polymer using a conventional composition.
Figure 4B:
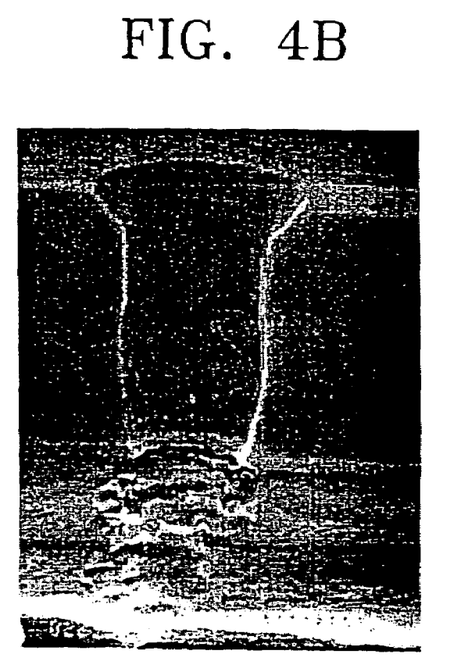
Figure 5:
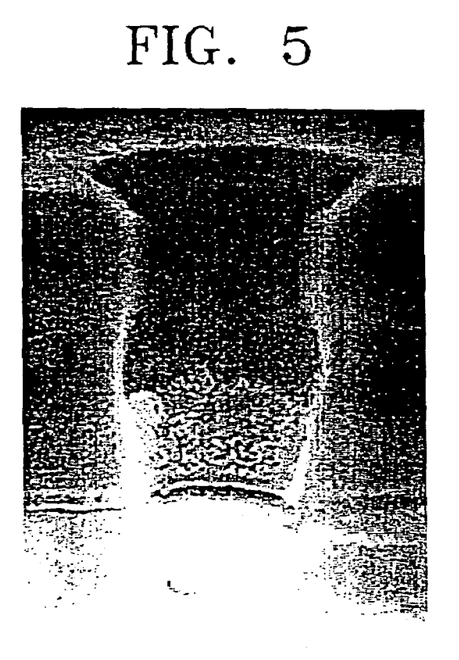
FIG. 5 is an SEM photograph of the sectional view of a via after removing a resist and polymer using another conventional composition.

The wafers subjected to the ashing step were dipped into the strippers A and B at 65° C. for 20 minutes, rinsed with deionized water and then dried. Thereafter, the top view and cross-sectional view of the via treated with the stripper A were observed using SEM and the observation results are shown in FIGS. 4A and 4B. The cross-sectional view of the via treated with the stripper B was observed using SEM and the observation result is shown in FIG. 5.

Figure 3A:
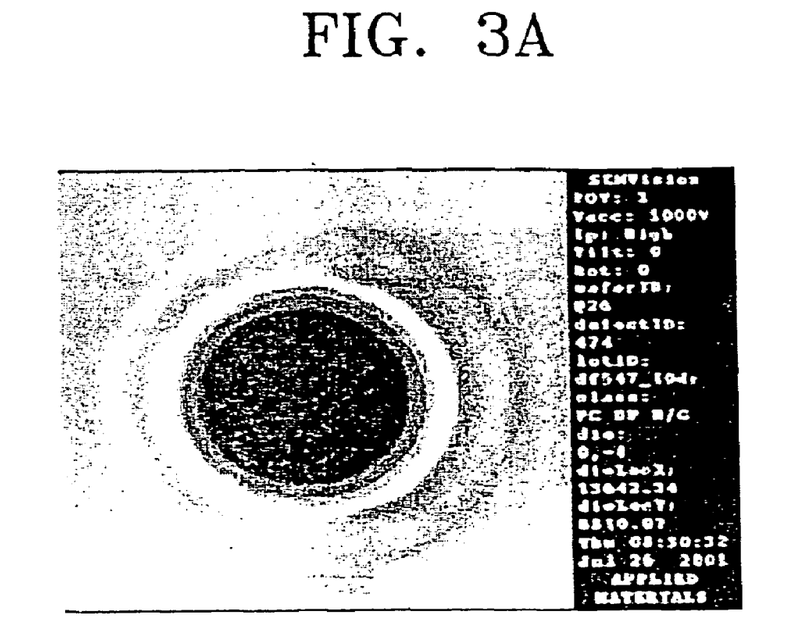
FIGS. 3A and 3B are SEM photographs of the top view and sectional view, respectively, of a via after removing a resist and polymer using the composition according to the present invention.
Figure 3B:
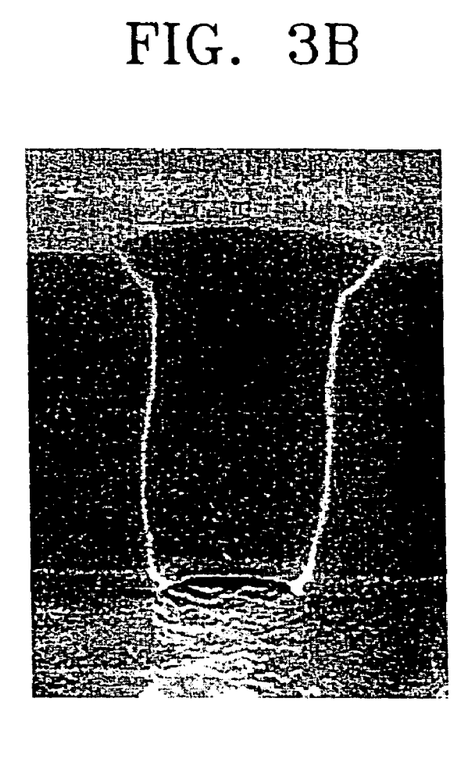

As shown in FIGS. 3A and 3B, in the case of using the composition according to the present invention, any polymer is completely removed and there is no undercutting of the aluminum interconnection layer. By contrast, as shown in FIGS. 4A and 4B, in the case of using the stripper A, some polymer remains on the aluminum interconnection layer and severe undercutting occurs. This is also true in the case of using the stripper B, as shown in FIG. 5.

EXAMPLE 4

This example illustrates how the compositions according to the present invention having different components affect metal layers. Samples formed by depositing a titanium layer and a titanium nitride layer on bear wafers to thickness of 200 Å, respectively, and a sample formed by depositing a tungsten layer on a bare wafer to a thickness of 2000 Å were prepared. The samples were treated with the composition having the same components as those of composition 5 listed in Table 2 and containing catechol instead of BTA, and with the stripper B at 65° C. for 20 minutes. Then, the etched extents of the respective layers were measured. According to the measurement results, in the case of using the composition according to the present invention, the titanium/titanium nitride layer was etched to a thickness of approximately 1.12 Å and the tungsten layer was etched to a thickness of approximately 18.61 Å. By contrast, in the case of using the stripper B, the titanium/titanium nitride layer was etched to a thickness of approximately 11.82 Å and the tungsten layer was etched to a thickness of approximately 27.44 Å. Conclusively, this shows that the composition according to the present invention can remarkably reduce the attack of a metal layer.

In summary, the resist removing composition according to the present invention has a superior capability of removing resist and can effectively remove etching by-products such as polymer, organometallic polymer or metal oxide. Also, the resist removing composition according to the present invention does not attack underlying layers exposed thereto. Thus, in the case of using the composition according to the present invention, a pre-removal step for removing residues such as polymer, and a post-removal step for preventing underlying layers from being attacked, are not necessary. Therefore, the resist removal process becomes simplified and processing time is shortened. Also, the resist removing apparatus for use in the composition according to the present invention becomes simplified and lightweight. Further, since the resist removing composition according to the present invention has a viscosity sufficient to be rinsed with deionized water, it can be completely cleaned with deionized water after it is used for resist removal, without leaving residual materials.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of removing resist, comprising:
providing a substrate having a resist layer formed thereon; and
contacting the substrate with a resist removing composition comprising alkoxy N-hydroxyalkyl alkanamide and a swelling agent to remove the resist layer from the substrate, wherein the swelling agent is a hydroxylamine salt.

2. The method of claim 1, wherein during the contacting, the alkoxy N-hydroxyalkyl alkanamide is represented by a formula, wherein $R_1$ is one of a hydrogen atom and a $C_1$ to $C_5$ hydrocarbon, and $R_2$, $R_3$ and $R_4$ are independently $C_1$ to $C_5$ hydrocarbons.

3. The method of claim 1, wherein the alkoxy N-hydroxyalkyl alkanamide comprises about 10 wt % to about 70 wt % with reference to a total weight of the resist removing composition.

4. The method of claim 1, wherein the hydroxylamine salt is one selected from the group consisting of hydroxylamine sulfate, hydroxylamine hydrochloride, hydroxylamine nitrate, hydroxylamine phosphate, hydroxylamine oxalate, hydroxylamine citrate, and mixtures thereof.

5. The method of claim 1, wherein the hydroxylamine salt is hydroxylamine sulfate.

6. The method of claim 3, wherein the swelling agent comprises about 0.01 wt % to about 30 wt % with reference to a total weight of the resist removing composition.

7. The method of claim 1, further comprising a polar material having a dipole moment of 3 or greater.

8. The method of claim 7, wherein the polar material is one selected from the group consisting of water, methanol and dimethyl sulfoxide.

9. The method of claim 7, wherein the polar material comprises about 0.01 wt % to about 60 wt % with reference to a total weight of the resist removing composition.

10. The method of claim 1, further comprising an attack inhibitor.

11. The method of claim 10, wherein the attack inhibitor is one selected from the group consisting of benzotriazole, catechol, gallic acid and an aliphatic carboxylic compound, and wherein the aliphatic carboxylic compound is one selected from the group consisting of acetic acid, citric acid, lactic acid and succinic acid.

12. The method of claim 10, wherein the attack inhibitor is benzotriazole.

13. The method of claim 10, wherein the attack inhibitor comprises about 0.01 wt % to about 30 wt % with reference to a total weight of the resist removing composition.

14. The method of claim 1, further comprising alkanolamine represented by a formula, wherein $R_5$ is one of a hydrogen atom and a $C_1$ to $C_5$ hydrocarbon, and $R_6$ is a $C_1$ to $C_5$ hydrocarbon.

15. The method of claim 14, wherein the alkanolamine comprises about 0.01 wt % to about 30 wt % with reference to a total weight of the resist removing composition.

16. The method of claim 1, comprising 10 to 70 wt % of the alkoxy N-hydroxyalkyl alkanamide and 0.01 to 30 wt % of the hydroxylamine salt as the swelling agent, and further comprising 0.01 to 60 wt % of a polar material having a dipole moment of 3 or greater.

17. The method of claim 16, further comprising 0.01 to 30 wt % of an attack inhibitor.

18. The method of claim 16, further comprising 0.01 to 30 wt % of alkanolamine.

* * * * *